United States Patent [19]

Sueoka et al.

[11] Patent Number: 4,574,296

[45] Date of Patent: Mar. 4, 1986

[54] GATE TURN-OFF THYRISTOR WITH A CATHODE BASE LAYER HAVING FOUR DISTINCT IMPURITY CONCENTRATIONS

[75] Inventors: Tetsuro Sueoka, Kawasaki; Takeharu Kubo, Tokyo, both of Japan

[73] Assignee: Kabushiki Kaisha Meidensha, Tokyo, Japan

[21] Appl. No.: 515,279

[22] Filed: Jul. 19, 1983

[30] Foreign Application Priority Data

Aug. 5, 1982 [JP] Japan .................... 57-136721

[51] Int. Cl.[4] ............................... H01L 29/74
[52] U.S. Cl. ......................... 357/38; 357/89; 357/20; 357/13
[58] Field of Search ............... 357/89, 38 G, 38 T, 357/38 A, 20, 13

[56] References Cited

U.S. PATENT DOCUMENTS

| 4,177,478 | 12/1979 | Senes | 357/38 |
| 4,291,325 | 9/1981 | Sueoka et al. | 357/38 |
| 4,315,274 | 2/1982 | Fukui et al. | 357/38 |

FOREIGN PATENT DOCUMENTS

| 0008535 | 3/1980 | European Pat. Off. | 357/386 |
| 2299727 | 1/1975 | France . | |
| 0063687 | 5/1977 | Japan | 357/386 |
| 0073585 | 6/1979 | Japan | 357/386 |
| 0046543 | 4/1980 | Japan | 357/386 |
| 2039413 | 1/1979 | United Kingdom . | |
| 1542227 | 3/1979 | United Kingdom . | |

OTHER PUBLICATIONS

Azuma et al., "2500-V600-A Gate Turn-Off Thyristor (GTO)", IEEE Transactions on Electron Devices, vol. Ed-28, No. 3, Mar., 1981.

Primary Examiner—Joseph E. Clawson, Jr.
Assistant Examiner—Robert P. Limanek
Attorney, Agent, or Firm—Stevens, Davis, Miller & Mosher

[57] ABSTRACT

A PNPN layer type gate turn-off thyristor including a first gate and a second gate comprises, in particular, a second P-type layer such that the impurity atom concentration at the auxiliary thyristor portion is lower than that at the main thyristor portion. Since the first gate disposed at the auxiliary thyristor portion is first fired and then the main thyristor portion is turned on, the above-mentioned impurity atom concentration profile is effective for reducing both the turn-on time and the turn-off time, that is, improving the di/dt capability of the thyristor.

4 Claims, 12 Drawing Figures

TURN ON

TURN OFF

GATE TURN-OFF THYRISTOR WITH A CATHODE BASE LAYER HAVING FOUR DISTINCT IMPURITY CONCENTRATIONS

BACKGROUND OF THE INVENTION

1. Field of the Invention

The present invention relates generally to a gate turn-off thyristor of an amplifying gate structure type and more particularly to a gate turn-off thyristor provided with a quick turn-on time and a quick turn-off time, that is, a large di/dt (current rise rate) capability at both the transient periods of turn-on and turn-off.

2. Description of the Prior Art

Generally, a gate turn-off thyristor is made up of four PNPN layers (three P-N junctions) and provided with an anode electrode A, a cathode electrode K, a first gate electrode $G_1$ disposed at the auxiliary thyristor portion and a second gate electrode $G_2$ disposed at the main thyristor portion. When a forward voltage is applied between the anode electrode A and the cathode electrode K and a triggering gate signal voltage is applied between the first gate electrode $G_1$ and the cathode electrode K, the resulting gate current flowing between the gate electrode $G_1$ and the cathode electrode K causes the thyristor to turn conductive. This turn-on operation of the thyristor takes place as follows: the resulting gate current first turns on a small area of the thyristor nearest to the first gate electrode $G_1$ and the cathode electrode K and then the thus generated conductive area expands throughout the whole body of the thyristor. In such a gate turn-off thyristor as described above, the controllable current value $I_{ATO}$ is the most important factor, which is represented by the magnitude of load current which can be turned off.

In order to improve the controllable current value $I_{ATO}$, a gate turn-off thyristor of buried low-resistance layer type is well known. However, in this type of thyristor, the more the controllable current value $I_{ATO}$ or the shorter the turn-off time, the longer the turn-on time. The desirable gate turn-off thyristor characteristics are such that a large load current must be turned on or off by a small gate current during a short rise time or a large di/dt capability. In other words, the turn-on characteristics of the thyristor is contradictory to the turn-off characteristics thereof. Therefore, it is essential to improve both the turn-on and turn-off characteristics at the same time.

A more detailed-description of an example of prior-art PNPN-semiconductor layer gate turn-off thyristor of buried low-resistance layer type will be made with reference to the attached drawings under DETAILED DESCRIPTION OF THE PREFERRED EMBODIMENTS.

SUMMARY OF THE INVENTION

With these problems in mind, therefore, it is the primary object of the present invention to provide a gate turn-off thyristor of four PNPN semiconductor layer type having superior turn-on and turn-off characteristics, that is, by which a large load current can be turned on or off within short turn-on or turn-off time with a large di/dt capability.

To achieve the above-mentioned object, the gate turn-off thyristor of four PNPN semiconductor layer type according to the present invention comprises, in particular, a second P-type gate control layer such that the impurity atom concentration at the auxiliary thyristor portion is lower than that at the main thyristor portion.

The above-mentioned impurity atom concentration profile results from the following conception: in the gate turn-off thyristor, the impurity atom concentration of the second P-type gate control layer exerts a decisive influence upon the turn-on and turn-off characteristics of the thyristor. In more detail, the more the impurity concentration, the shorter the turn-off time but the longer the turn-on time. Therefore, in order to achieve these two contradictory requirements at the same time, attention is paid to the positions of the first gate $G_1$ and the gate $G_2$. That is to say, when the thyristor is turned on, the first gate $G_1$ disposed at the auxiliary thyristor portion is first fired and then the main thyristor portion is turned on; when the thyristor is turned off, the second gate $G_2$ disposed at the main thyristor portion is mainly turned off. Accordingly, it is effective to decrease the impurity atom concentration at the auxiliary thyristor portion (first gate electrode $G_1$) for reducing the turn-on time and to increase the impurity atom concentration at the main thyristor portion (second gate electrode $G_2$) for simultaneously reducing the turn-off time.

BRIEF DESCRIPTION OF THE DRAWINGS

The features and advantages of the gate turn-off thyristor of four PNPN semiconductor layer type according to the present invention over the prior art gate turn-off thyristor will be more clearly appreciated from the following description of the preferred embodiment of the invention taken in conjunction with the accompanying drawings in which like reference numerals designate the same or similar elements or sections throughout the figures thereof and in which;

FIG. 3(A) is a graphical representation showing a voltage waveform obtained when the gate turn-off thyristor shown in FIG. 1 is turned on;

DETAILED DESCRIPTION OF THE PREFERRED EMBODIMENTS

To facilitate understanding of the present invention, a brief reference will be made to an example of a prior-art disk-shaped gate turn-off thyristor including four PNPN semiconductor layers of buried low-resistance layer type with reference to the attached drawings.

Figure 1:
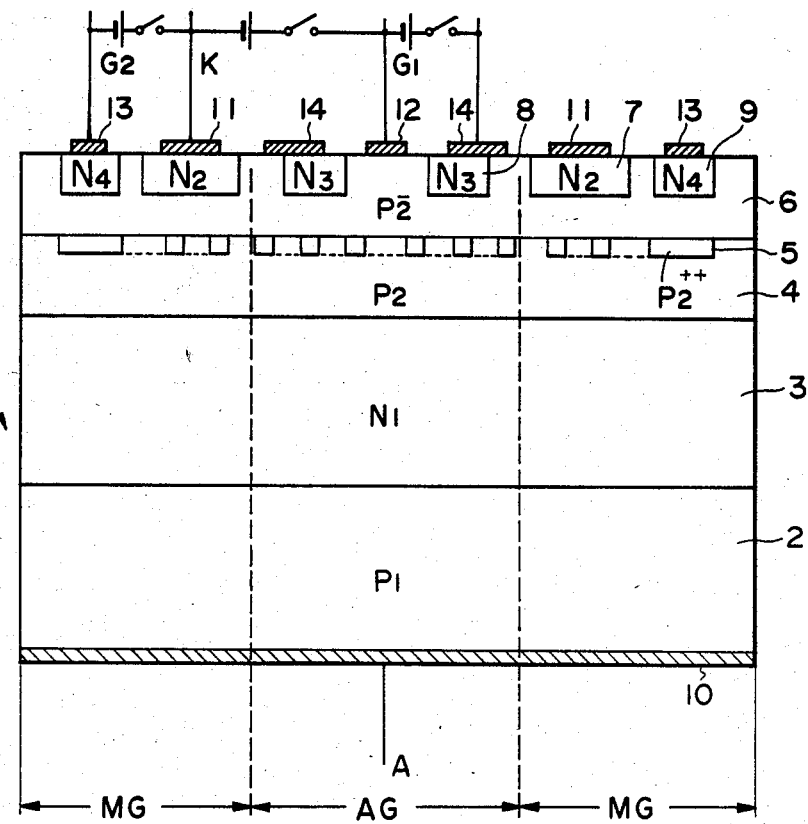
FIG. 1 is a cross-sectional view of a prior-art disk-shaped gate turn-off thyristor including four PNPN semiconductor layers of buried low-resistance layer type.

In FIG. 1, the thyristor is made of a disk-shaped device 1 having four PNPN semiconductor layers of a first P-type ($P_1$) layer 2, a first N-type ($N_1$) layer 3, second two P-type ($P_2$, $P_2^-$) layers 4 and 6, and second three N-type ($N_2$, $N_3$, $N_4$) layers 7, 8 and 9. The second P-type ($P_2$, $P_2^-$) layers 4 and 6 are formed with a medium impurity atom concentration P-type ($P_2$) layer 4 and a lower impurity atom concentration (high resistance) P-type ($P_2^-$) layer 6. Between the second two P-type ($P_2$, $P_2^-$) layers 4 and 6, two separate, concentrically-arranged and radially connected mesh-structure higher impurity atom concentration (low resistance) P-type ($P_2^{++}$) semiconductor layers 5 are formed as two different buried low-resistance layers corresponding to the first and second gate electrodes $G_1$ and $G_2$. In the second lower impurity atom concentration (high resistance) P-type ($P_2^-$) layer 6, a plurality of N-type layers are formed; that is, a second intermediate, annular large-area-N-type ($N_2$) semiconductor layer 7 is formed as a cathode layer; a third innermost, annular small-areas N-type ($N_3$) semiconductor layer 8 is formed as a gate current amplifying layer; a fourth outermost, annular N-type ($N_4$) semiconductor layer 9 is formed as a second gate layer, these three annular N-type layers $N_2$, $N_3$ and $N_4$ being arranged concentrically with each other.

Further, the thyristor 1 comprises a large circular metal anode electrode 10, an intermediate annular metal cathode electrode 11, a small circular metal first gate electrode 12, an outer annular metal second gate electrode 13, and an inner annular metal gate current amplifying electrode 14.

The large circular metal anode electrode 10 is formed on the exposed outer surface of the first P-type ($P_1$) layer 2 of the semiconductor device 1 as an anode portion A; the intermediate annular metal cathode electrode 11 is formed on the second N-type ($N_2$) layer 7 as a cathode portion K; the small circular metal first gate electrode 12 is formed directly at the center of the second P-type ($P_2^-$) layer 6 of the device 1 as a first gate electrode portion $G_1$; the outer annular metal second gate electrode 13 is formed on the fourth N-type ($N_4$) layer 9 as a second gate electrode portion $G_2$; the inner annular metal gate current amplifying electrode 14 is formed on the third N-type ($N_3$) layer 8 and the second P-type ($P_2^-$) layer 6 as a gate current amplifying electrode portion 14, respectively.

As depicted by the dashed lines in FIG. 1, the main gate turn-off thyristor portion MG made up of the outer portion of the device 1, that is, the first P-type ($P_1$) layer 2, the first N-type ($N_1$) layer 3, the second P-type ($P_2$, $P_2^-$) layers 4 and 6, the higher impurity atom concentration P-type ($P_2^{++}$) layer 5, the second N-type ($N_2$) layer 7, the fourth N-type ($N_4$) layer 9, while the auxiliary gate turn-off thyristor portion AG is made up of the inner portion of the device 1, that is, the first P-type ($P_1$) layer 2, the first N-type ($N_1$) layer 3, the second P-type ($P_2$, $P_2^-$) layers 4 and 6, the higher impurity atom concentration P-type ($P_2^{++}$) layer 5, and the third N-type ($N_3$) layer 8.

Figure 2:
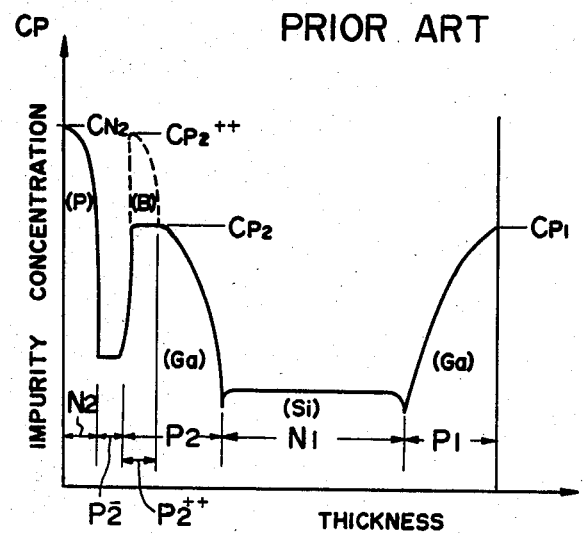
FIG. 2 is a graphical representation showing the impurity atom concentration profile of the prior-art gate turn-off thyristor shown in FIG. 1, in which the abscissa represents the thickness of the disk-shaped thyristor device and the ordinate represents the impurity atom concentration.

The method of manufacturing the gate turn-off thyristor shown in FIG. 1 will be described hereinbelow. The manufacturing steps are as follows:

(1) gallium (Ga) is diffused on both the surfaces of a negative (N-type) silicon wafer by enclosed diffusion method in order to form the first P-type ($P_1$) layer 2 having an impurity atom concentration $C_{p1}$ shown in FIG. 2 and the second P-type ($P_2$) layer 4 having the same concentration $C_{p1} = C_{p2}$. In the enclosed diffusion method, the silicon wafer and the gallium are enclosed within a quartz tube and then heated to an appropriate temperature at which the enclosed gallium can sufficiently diffuse on to both the surfaces of the silicon wafer. Since the silicon and gallium are both enclosed, it is possible to obtain relatively uniform impurity atom concentration throughout the surfaces of the silicon wafer, while preventing other atoms from being diffused into the wafer.

(2) a predetermined mesh-structure pattern mask of silicon oxide ($SiO_2$) is formed on the surface of the second P-type ($P_2$) layer 4 in accordance with photo engraving process and boron is selectively diffused on the layer 4 at a relatively high impurity concentration rate in order to form the high concentration (low resistance) mesh-structure P-type ($P_2^{++}$) layer 5 having an impurity atom concentration $C_{p2}^{++}$ shown in FIG. 2.

To describe the photo engraving process in more detail, a continuous layer of silicon oxide is formed throughout the surface of the second P-type ($P_2$) layer 4; the oxide layer is covered with a photosensitive resin; the photosensitive resin is irradiated through a pattern mask; the parts of the irradiated photosensitive resin are eliminated; the oxide layer is eliminated through the openings of the eliminated photosensitive resin; finally the remaining parts of the photosensitive resin are eliminated.

(3) the second lower impurity atom concentration (high resistance) P-type ($P_2^-$) layer 6 is formed onto the $P_2^{++}$ layer 5 and the $P_2$ layer 4 in accordance with epitaxial growth method (silicon crystal layer is grown on a silicon monocrystal in the same crystal orientation in accordance with vapor phase epitaxy).

(4) another predetermined pattern mask of silicon oxide ($SiO_2$) is formed again on the surface of the second lower concentration (high resistance) P-type ($P_2^-$) layer 6 in accordance with photo engraving process and phosphor (P) is selectively diffused on the surface of the layer 6 in order to form three concentrically-arranged annular second N-type ($N_2$, $N_3$, and $N_4$) layer 7, 8 and 9 at the same time having an impurity atom concentration $C_{N2}$ as shown in FIG. 2. (in FIG. 2, only $C_{N2}$ is indicated).

(5) the anode electrode 10, the cathode electrode 11, the gate current amplifying electrode 14, the first gate electrode 12 and the second gate electrode 13 are formed, respectively.

FIG. 2 shows the impurity atom concentration profile, in which the abscissa represents the thickness of the disk-type gate turn-off thyristor shown in FIG. 1 and the ordinate represents the impurity atom concentration rate (atoms per cubic centimeters). Further, the typical thickness of each semiconductor layer is approximately 250 micrometers in the first N-type ($N_1$) layer 3, 25 micrometers in the first P-type ($P_1$) layer 2 and the second ordinary P-type ($P_2$) layer 4, 7 micrometers in the low resistance P-type ($P_2^{++}$) layer 5, and 10 micrometers in the second, third and fourth N-type ($N_2$, $N_3$, $N_4$) layers 7, 8 and 9. The typical resistivity of the $N_1$ layer 3 is 50 ohm-centimeter; the sheet resistance of the $P_2$ layer 4 is 5 ohms and that of the $P_2^{++}$ layer 5 is 0.5 ohms. Furthermore, the impurity atom concentration of the $N_2$ layer 7 is about from 1 to $5 \times 10^{20}$ atoms per cubic centimeter.

Figure 3A:
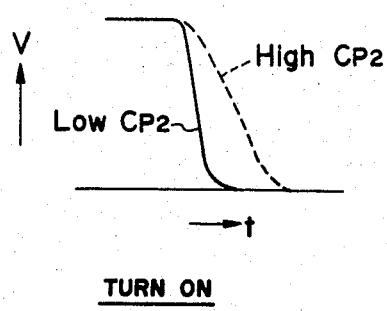
Figure 3B:
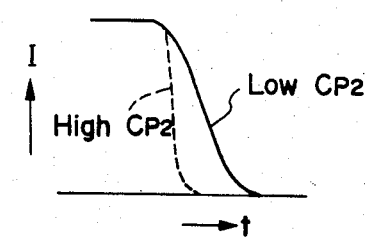
FIG. 3(B) is a graphical representation showing a current waveform obtained when the gate turn-off thyristor shown in FIG. 1 is turned off.
Figure 4:
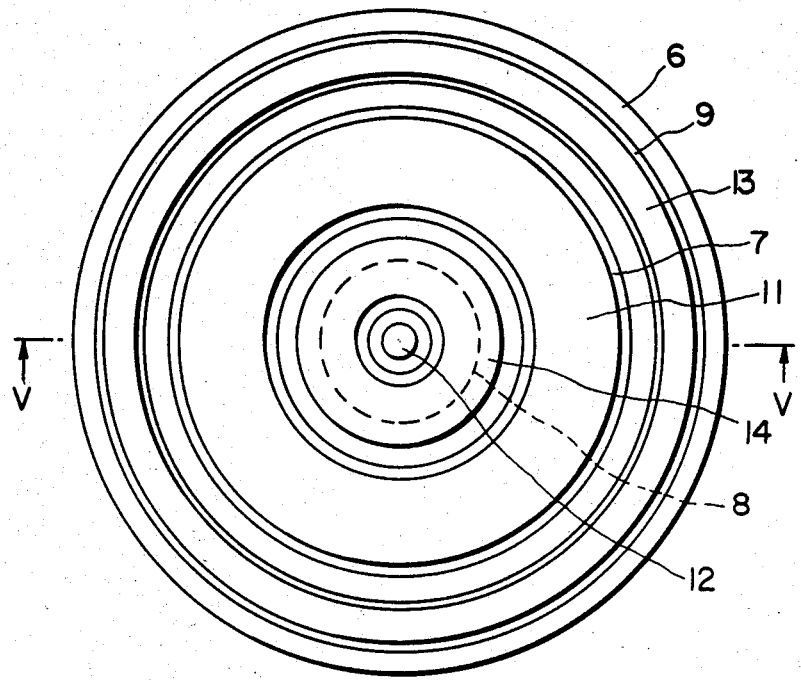
FIG. 4 is a top view of an embodiment of the disk-shaped gate turn-off thyristor including four PNPN semiconductor layer of buried low-resistance layer type according to the present invention.

Various experiments indicate that the surface impurity atom concentration $C_{p2}$ in the second P-type ($P_2$) semiconductor layer 4 in which the mesh-structure higher concentration (low resistance) P-type ($P_2^{++}$) semiconductor layers 5 are buried effects an important influence upon the dynamic characteristics of the gate turn-off thyristor. FIG. 3(A) shows a voltage waveform obtained when the thyristor is turned on and FIG. 3(B) shows a current waveform obtained when the thyristor is turned off. These drawings clearly indicate that the lower the surface impurity atom concentration $C_{p2}$, the shorter the turn-on time but the longer the turn-off time; in other words, the higher the concentration $C_{p2}$, the longer the turn-on time but shorter the turn-off time. An increase in the turn-off time implies a decrease in the magnitude of current which can be turned off. The preferable characteristics required for the thyristor are such that (1) a large load current must be turned on or off by small gate turn-on or turn-off signals, and (2) the turn-on or turn-off time must be as short as possible; that is, the rise time of the load current must be as short as possible or the di/dt capability must be as large as possible. Although both the requirements described above are contradictory to each other, it is very important to satisfy both the contradictory requirements in the gate turn-off thyristor.

In view of the above description, reference is now made to the embodiment of the disk-shaped gate turn-off thyristor including four PNPN layers of buried low-resistance layer type according to the present invention with reference to the attached drawings.

Figure 5:
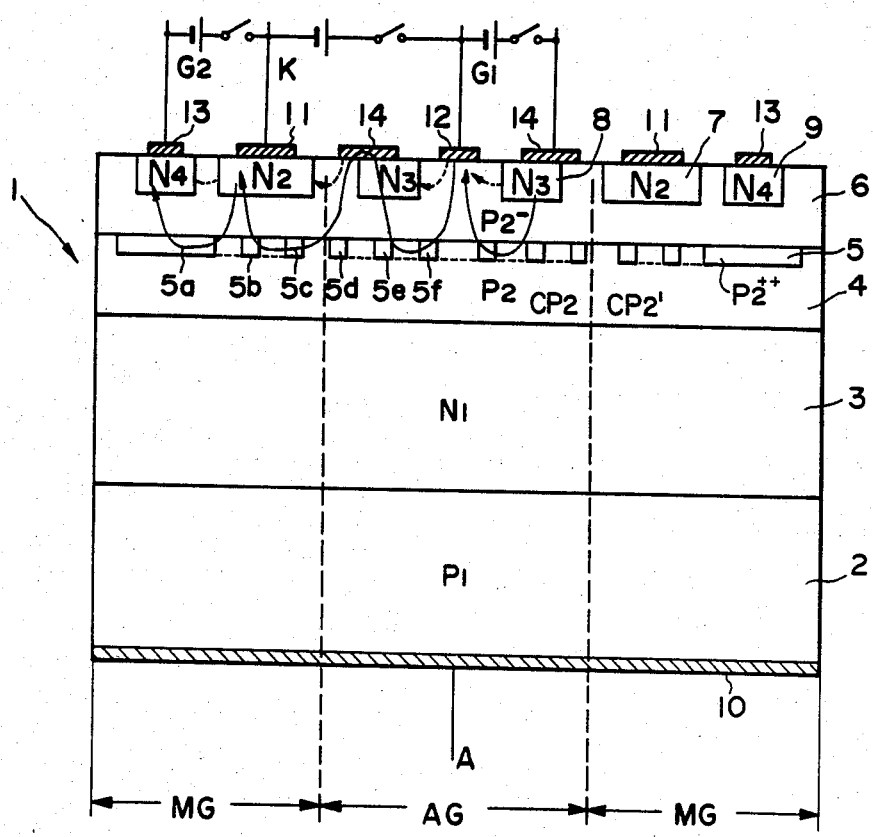
FIG. 5 is a cross-sectional view taken along the line V—V in FIG. 4.

In FIG. 5, the disk-shaped thyristor is made up of a semiconductor device 1 including four PNPN semiconductor layers of a first P-type ($P_1$) layer 2, a first N-type ($N_1$) layer 3, second two P-type ($P_2$, $P_2^-$) layers 4 and 6, and second three N-type ($N_2$, $N_3$, $N_4$) layer 7, 8 and 9. The second P-type ($P_2$, $P_2^-$) layer is formed with a medium impurity atom concentration P-type ($P_2$) layer 4 and a lower impurity atom concentration (high resistance) ($P_2^-$) layer 6. The second N-type layer is formed with three concentrically-arranged semiconductor layers of an inner small-area ($N_3$) layer 8 for amplifying the gate current, an outer ($N_4$) layer 9 and an intermediate large-area ($N_2$) layer 7. Between the upper surface of the second ordinary P-type ($P_2$) layer 4 and the lower surface of the second lower impurity atom concentration P-type ($P_2^-$) layer 6, there are buried two separate concentrically-arranged and radially-connected mesh-structure higher impurity atom concentration (lower resistance) P-type ($P_2^{++}$) semiconductor layers 5a to 5f. In more detail, a number of mesh-structure higher concentration P-type ($P_2^{++}$) layer 5a to 5c are buried under the intermediate annular ($N_2$) layer 7 and the outer annular ($N_4$) layer 9; a number of mesh-structure higher concentration P-type ($P_2^{++}$) layer 5 (5d to 5f) are buried under the inner annular ($N_3$) layer 8, two mesh-structure layers (5a to 5c) and (5d to 5f) being separated from each other.

Further, in FIG. 5, the reference numeral 10 denotes a large circular metal anode electrode; the numeral 11 denotes a medium sized annular metal cathode electrode; the numeral 12 denotes a first small circular metal gate electrode; the numeral 13 denotes a second outer annular metal gate electrode; the numeral 14 denotes an inner annular metal amplification gate electrode. The first gate electrode portion $G_1$ is made up of the second lower impurity concentration P-type ($P_2^-$) layer 6 and a number of mesh-structure higher impurity concentration P-type ($P_2^{++}$) layer 5d to 5f; the second gate electrode portion $G_2$ is made up of the outer annular N-type ($N_4$) layer 9 and the mesh-structure higher impurity concentration P-type ($P_2^{++}$) layer 5a to 5c. The amplification gate electrode portion 14 is formed on the second lower impurity concentration P-type ($P_2^-$) layer 6 and the inner annular N-type ($N_3$) layer 8 so as to short the layer 6 to the layer 8.

As depicted by the dashed lines in FIG. 5, the main gate turn-off thyristor portion MG is made up of the outer portion of the semiconductor device 1, that is, the first P-type ($P_1$) layer 2, the first N-type ($N_1$) layer 3, the second P-type ($P_2$) layer 4, the higher impurity concentration P-type ($P_2^{++}$) layer 5 (5a, 5b and 5c), the second lower impurity concentration layer 6, the intermediate annular N-type ($N_2$) layer 7 and the outer annular N-type ($N_4$) layer 9; while the auxiliary gate turn-off thyristor AG is made up of the inner portion of the semiconductor device 1, that is, the first P-type ($P_1$) layer 2, the first N-type ($N_1$) layer 3, the second P-type ($P_2$) layer 4, the higher impurity concentration P-type ($P_2^{++}$) layer 5 (5d, 5e and 5f), the second lower impurity concentration layer 6, and the inner annular N-type ($N_3$) layer 8.

The turn-on and turn-off operations of this type of gate turn-off thyristor will be described hereinbelow. When a gating voltage is applied to turn on the thyristor between the first gate electrode $G_1$ and the cathode electrode K ($G_1$: positive, K: negative) under the condition that a forward bias voltage is applied between the anode electrode A and the cathode electrode K, the auxiliary thyristor portion AG is first fired locally. Namely, the gate major current flows by way of the first gate electrode $G_1$, the $P_2^-$ layer 6, the $P_2^{++}$ layer 5 (5f, 5e, 5d), the $P_2^-$ layer 6, the $N_3$ layer 8, the gate current amplifying electrode 14, the $P_2^-$ layer 6, the $P_2^{++}$ layer 5 (5c, 5b), the $P_2^-$ layer 6, the $N_2$ layer 7 and the cathode electrode K. The gate small current flows by way of the first gate electrode $G_1$, the $P_2^-$ layer 6, the $N_2$ layer 8, the gate amplifying electrode 14, the $P_2^-$ layer 6, and the $N_2$ layer 7 and the cathode electrode K. As a result, in the auxiliary thyristor portion AG, the amplified major current flows from the anode A by way of the $P_1$ layer 2, the $N_1$ layer 3, the $P_2$ layer 4, the $P_2^-$ layer 6, the $N_3$ layer 8, the gate current amplifying electrode 14, the $P_2^-$ layer 6, the $P_2^{++}$ layer 5 (5c, 5b), the $P_2^-$ layer 6, the $N_2$ layer 7 and the cathode K. The amplified small current flows from the gate current amplifying electrode 14, the $P_2^-$ layer 6, the $N_2$ layer 7 and the cathode electrode K. This amplified current is added to the gating current flowing from the gate electrode $G_1$ to the cathode electrode K to increase the gating current. Therefore, the resulting gate current which turns on a small area of the auxiliary thyristor portion AG fires the main thyristor portion MG while expanding at a spreading velocity.

When two different voltages are simultaneously applied to turn off the thyristor between the second gate electrode $G_2$ and the cathode electrode K ($G_2$: negative, K: positive), and between the first gate electrode $G_1$ and the gate current amplifying electrode 14 ($G_1$: negative, amplifying electrode 14: positive), respectively, current flows from the $N_2$ layer 2, through the $P_2^-$ layer 6, the $P_2^{++}$ layer 5 (5c, 5b, 5a), and the $P_2^-$ layer 6, to the $N_4$ layer 13, and further another current flows from the $N_3$ layer 8 of a small area, the $P_2^-$ layer 6, the $P_2^{++}$ layer 5 (5d, 5e, 5f), to the $P_2^-$ layer 6 and the first gate electrode $G_1$ simultaneously and respectively. As a result, the main thyristor portion MG and the small-area auxiliary thyristor portion AG are almost simultaneously turned off.

The gate turn-off thyristor according to the present invention is used as a power switching element type such that the maximum voltage is about 1200 volts and the maximum current is about 1000 amperes.

The manufacturing steps of the gate turn-off thyristor according to the present invention will be described hereinbelow with reference to FIG. 6(A) to FIG. 6(D) and FIG. 7.

Figure 6A:
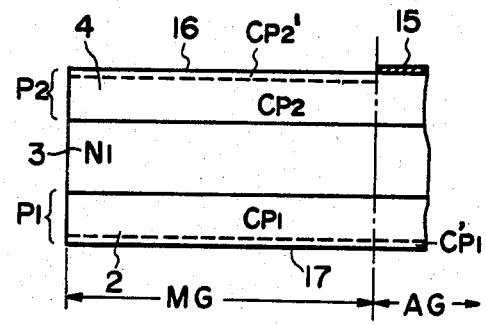
FIGS. 6(A) to 6(D) are illustrations for assistance in explaining the manufacturing steps of the disk-shaped gate turn-off thyristor including four PNPN semiconductor layer of buried low-resistance layer according to the present invention.
Figure 7:
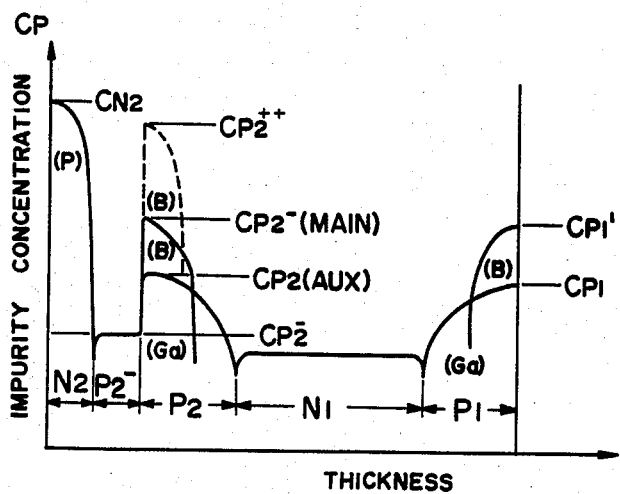
FIG. 7 is a graphical representation showing the impurity atom concentration profile of the gate turn-off thyristor according to the present invention shown in FIG. 5, in which the abscissa represents the thickness of the disk-shaped thyristor device and the ordinate represents the impurity atom concentration.

(1) With reference to FIG. 6(A), a N-type monocrystalline silicon wafer having a thickness of about 300 micrometers and a resistivity of 50 ohm-centimeter, one surface of which is mirror-polished to form the second P-type ($P_2$) layer 4, is prepared. Gallium is diffused on the two surfaces of the wafer in accordance with enclosed diffusion method (described before) to a depth of 30 micrometers with a surface impurity atom concentration of about $3 \times 10^{17}$ atoms per cubic centimeter in order to form the first P-type ($P_1$) layer 2 and the second P-type ($P_2$) layer 4. The impurity concentrations $C_{p1}$ and $C_{p2}$ of the first and second P-type ($P_1$ and $P_2$) layers 2 and 4 are shown in FIG. 7.

Here, it should be noted that the impurity concentration $C_{p2}$ ($3 \times 10^{17}$ atoms/cm$^3$) is suitable for the $P_2$ layer 4 at the auxiliary thyristor portion AG but the impurity concentration $C_{p2}$ ($3 \times 10^{17}$ atoms/cm$^3$) is not sufficient for the $P_2$ layer 4 at the main thyristor portion MG.

(2) Therefore, a mask 15 of silicon oxide ($SiO_2$) is formed on the upper surface of the wafer so as to cover only the second $P_2$ layer 4 of the auxiliary thyristor portion AG. The silicon oxide mask can be formed by the photo engraving process as already described hereinbefore.

Consecutively, boron is selectively diffused on both the surfaces of the wafer excepting the second $P_2$ layer of the auxiliary thyristor portion mask 15 in order to form the layers 16 and 17 having greater impurity concentrations $C_{p1}'$ and $C_{p2}'$ of about $1 \times 10^{18}$ atoms per cubic centimeter and a diffusion depth of about 5 micrometers and then boron is further diffused in the drive-in diffusion method. In more detail, boron is first deposited onto each surface of the layers 16 and 17 and then heated to an appropriate temperature for diffusion. The resulting impurity concentration $C_{p1}'$ or $C_{p2}'$ is about $7 \times 10^{17}$ atoms per cubic centimeter and the diffusion depth is about 7 micrometers, respectively.

Figure 6B:
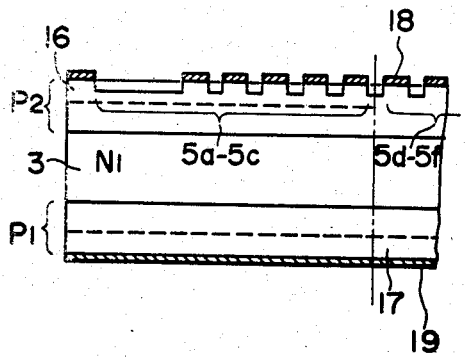

(3) With reference to FIG. 6(B), another silicon oxide mask 18 is formed on the upper surface of the wafer. Boron is additionally and selectively diffused on the upper surface in order to form the mesh-structure higher impurity concentration ($P_2^{++}$) buried low-resistance layers 5a to 5f. The concentration $C_{p2}^{++}$ is about $1 \times 10^{20}$ atoms per cubic centimeter and the diffusion depth is about 7 micrometers. In this step, a silicon oxide mask 19 is formed on the lower surface of the wafer for prevention of additional diffusion.

Figure 6C:
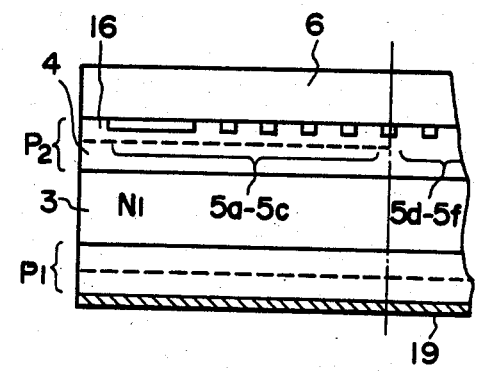

(4) With reference to FIG. 6(C), an epitaxial monocrystalline silicon layer 6 including boron is grown on the upper surface of the layer 16 of the second P-type ($P_2$) layer 4, the surface of the P-type ($P_2$) layer at the auxiliary thyristor portion AG and the $P_2^{++}$ layer 5 in order to form the second lower impurity concentration P-type ($P_2^-$) layer 6. The impurity concentration $C_{p2}^-$ is about $5 \times 10^{15}$ atoms per cubic centimeter and the growth height is about 25 micrometers. In this state, the mesh-structure higher impurity concentration P-type ($P_2^{++}$) layer 5 is buried within the $P_2$ layer 4 being sandwiched between the $P_2$ layer 4 and the $P_2^-$ layer 6.

Figure 6D:
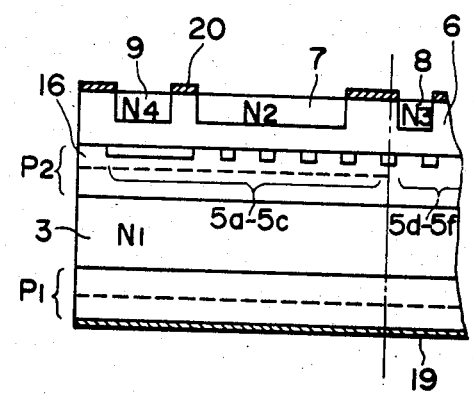

(5) With reference to FIG. 6(D), the other silicon oxide mask 20 is formed on the upper surface of the $P_2^-$ layer 6 and phospher is selectively diffused on the surface of the $P_2^-$ layer 6 through the mask in order to form the $N_2$ layer 7, the $N_3$ layer 9 and the $N_4$ layer 9. Each impurity concentration $P_{N2}$, $P_{N3}$, or $P_{N4}$ is about $2 \times 10^{20}$ atoms per cubic centimeter and the diffusion depth is about 10 micrometers. In FIG. 7, only the $C_{N2}$ is shown.

(6) Finally, gold is deposited on the surfaces of the semiconductor device and diffused at a high temperature in order to improve the lifetime. The anode electrode A, the cathode electrode K, the amplifying electrode 14, the first gate electrode $G_1$ and the second gate electrode $G_2$ are bonded to the predetermined positions of the semiconductor device.

Figure 8:
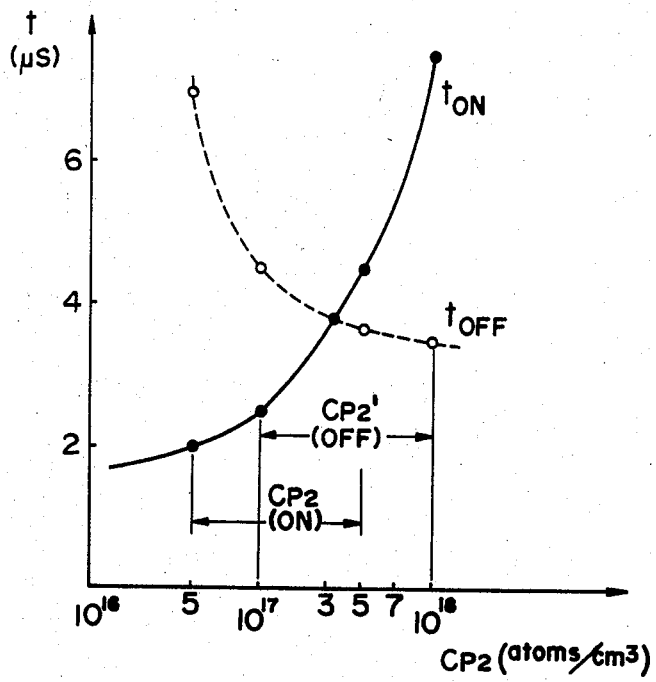
FIG. 8 is a graphical representation showing the turn-on characteristic and the turn-off characteristic of the gate turn-off thyristor according to the present invention, in which the abscissa represents the impurity atom concentration and the ordinate represents the turn-on or turn-off time.

In the gate turn-off thyristor as described above, it has been well known that the surface impurity atom concentration $C_{p2}$ of the second P-type ($P_2$) layer 4 exerts a decisive influence upon the turn-on or turn-off characteristics of the thyristor. FIG. 8 shows the relationship between the impurity concentration $C_{p2}$ and the turn-on time or the turn-off time. This figure clearly indicates that the more the concentration $C_{p2}$, the shorter the turn-off time but the longer the turn-on time. In order to satisfy the above-mentioned two contradictory requirements, that is, to improve the turn-on time and the turn-off time simultaneously, the present invention pays special attention to the following facts: when the thyristor is turned on, since the first gate $G_1$ is disposed at the auxiliary thyristor portion AG, the auxiliary thyristor AG is first fired and then the main thyristor portion MG is turned on; when the thyristor is turned off, since the second gate $G_2$ is disposed at the main thyristor portion MG and the first gate $G_1$ is disposed at the auxiliary thyristor portion AG, the main thyristor portion and the auxiliary thyristor portion are simultaneously turned off. Therefore, it is effective to decrease the impurity concentration $C_{p2}$ of the second P-type ($P_2$) layer 4 at the auxiliary thyristor portion AG in order to decrease the turn-on time and to increase the impurity concentration $C_{p2}$ at the main thyristor portion MG, through which the major load current flows, in order to simultaneously decrease the turn-off time.

FIG. 8 indicates that it is preferable to determine the impurity concentration $C_{p2}$ within a range from $5 \times 10^{16}$ to $5 \times 10^{17}$ atoms per cubic centimeter at the auxiliary thyristor portion of the $P_2$ layer 4 and the impurity concentration $C_{p2}'$ within a range from $1 \times 10^{17}$ to $1 \times 10^{18}$ atoms per cubic centimeter at the main thyristor portion of the $P_2$ gate layer 4.

In the gate turn-off thyristor according to the present invention in which the impurity concentration $C_{p2}$ at the auxiliary thyristor portion AG is determined to be smaller than that $C_{p2}'$ at the main thyristor portion MG, various advantages and features can be obtained as follows:

(1) The turn-on spreading velocity within the turn-on region is increased and therefore the turn-on characteristics are improved. For instance, the turn-on time is reduced from 8 to 10 microseconds to 3 to 5 microseconds and the gate firing current is also reduced from 0.5 to 0.8 amperes to 0.1 to 0.2 amperes.

(2) Conventionally, in the case when the thyristor is turned on by a gate drive current of 3 amperes, a load current turn-on capability (di/dt) is about 400 to 500 amperes per microsecond. However, in the thyristor according to the present invention, the turn-on capability (di/dt) is increased to about 1000 to 5000 amperes per microsecond under the same conditions. The reason is considered as follows: the resistance of the $P_2$ layer 4 of the auxiliary thyristor portion AG is greater than that of the $P_2$ layer 4 of the main thyristor portion MG (semiconductor resistance is inversely proportional to the impurity concentration) and therefore the N-type ($N_3$) layer 8 is not destroyed due to a greater di/dt (500 to 10000 A/μs) but the intermediate N-type ($N_2$) layer 7 is destroyed due to a greater di/dt (more than 5000 A/μs). On the other hand, in the conventional thyristor, since the resistance of the $P_2$ layer 4 is uniform at the auxiliary thyristor portion AG and the main thyristor portion MG, the inner N-type ($N_3$) layer 8 is destroyed due to a greater di/dt (more than 500 A/μs).

(3) The turn-off time is reduced from 4 to 6 microseconds to 3 to 4 microseconds. As a result, the controllable current or the load current which can be turned off is improved about 150 percent.

Additionally, in the gate turn-off thyristor according to the present invention, in order to prevent a parasitic thyristor portion at the second gate portion from being turned on, the higher impurity concentration P-type ($P_2^{++}$) buried layer 5 is formed widely enough to cover the N-type ($N_4$) layer 9. This is because the parasitic thyristor is usually formed by way of the first P-type ($P_1$) layer 2, the first N-type ($N_1$) layer 3, the second P-type ($P_2$, $P_2^-$) layers 4 and 6 and the second N-type ($N_4$) layer 9 in dependence upon a current flowing from the anode A to the second gate $G_2$ when the thyristor is turned off.

The above description has been made of the gate turn-off thyristor of buried low-resistance layer type. However, without being limited to this type of thyristor, it is also possible to apply the present invention to various gate turn-off thyristors in which the higher impurity concentration $P_2^{++}$ layer 5 is not buried on the surface of the second P-type ($P_2$) layer 4 but at least one partial area with a maximum impurity concentration is formed in the exposed surface of the second P-type ($P_2$) layer 4.

As described above, in the gate turn-off thyristor according to the present invention in which the main thyristor portion MG is made up of the $P_1$ layer 2, the $N_1$ layer 3, the $P_2$ layer 4, the $P_2^{++}$ layer 5, the $P_2^-$ layer 6 and the $N_2$ layer 7; the auxiliary thyristor portion AG is made up of the $P_1$ layer 2, the $N_1$ layer 3, the $P_2$ layer 4, the $P_2^{++}$ layer 5, the $P_2^-$ layer 6 and the $N_3$ layer 8; and the impurity concentration $C_{p2}$ of the second P-type ($P_2$) layer is the highest at the middle portion thereof, since the impurity concentration $C_{p2}$ of the second P-type ($P_2$) layer is the lowest between the highest impurity concentration middle portion and the second N-type layer and the impurity concentration $C_{p2}$ of the $P_2$ layer 4 under the $N_3$ layer 8 (at the auxiliary portion) is determined to be lower than that $C_{p2}'$ of the $P_2$ layer 4 under the $N_2$ layer 7 (at the main portion), it is possible to provide a thyristor having both good turn-on and turn-off characteristics.

It will be understood by those skilled in the art that the foregoing description is in terms of a preferred embodiment of the present invention wherein various changes and modifications may be made without departing from the spirit and scope of the invention, as set forth in the appended claims.

What is claimed is:

1. In a gate turn-off thyristor having an anode A, cathode K, a first gate $G_1$, a second gate $G_2$ and a gate current amplifying electrode arranged between the cathode and the first gate, the cathode and the second gate being arranged in a main thyristor portion MG and the first gate and the gate current amplifying electrode being arranged in an auxiliary thyristor portion AG, both the main and auxiliary thyristor portions being formed with a semiconductor device including alternately-different four PNPN semiconductor layers comprised of:

(a) a first P-type layer $P_1$ having an anode electrode;
(b) a first N-type layer $N_1$ adjoining said first P-type layer $P_1$;
(c) a second P-type layer including:
   a first-impurity atom concentrations $CP_2$ and $CP_2'$ layer $P_2$ both contacting said first N-type layer $N_1$; and
   a second-impurity atom concentration $CP_2^-$ layer $P_2^-$ adjoining said first-impurity atom concentration layer $P_2$ and under the cathode K and first and second electrodes $G_1$ and $G_2$, said second concentration $CP_2^-$ being of lower concentration than concentrations $CP_2$ and $CP_2'$; and
(d) a plurality of second N-type layers formed in the layer $P_2^-$ and including a layer $N_2$ formed under the cathode, a layer $N_3$ formed under the gate current amplifying electrode, wherein said first-impurity atom concentration layer $P_2$ includes an impurity atom concentration $CP_2'$ formed in the main thyristor portion MG having a higher impurity concentration than the impurity atom concentration $CP_2$ formed in the auxiliary thyristor portion AG, whereby turn-on time and turn-off time of the thyristor are both improved.

2. A gate turn-off thyristor as set forth in claim 1, wherein a third low-resistance impurity atom concentration $CP_2^{++}$ layer $P_2^{++}$ is buried in the first-impurity atom concentration layer $P_2$ and between the two layers $P_2$ and $P_2^-$, the third concentration $CP_2^{++}$ being higher than the impurity atom concentration $CP_2'$ formed in the main thyristor portion MG.

3. A gate turn-off thyristor as set forth in claim 2, wherein said third low-resistance impurity atom concentration $CP_2^{++}$ layer $P_2^{++}$ is divided into two separate layers one of said separate layers in the main thyristor portion MG and the other of said separate layers in the auxiliary thyristor portion AG.

4. A gate turn-off thyristor as set forth in claim 1, wherein the impurity atom concentration $CP_2$ of the layer $P_2$ formed in the auxiliary thyristor portion AG is approximately $3 \times 10^{17}$ atoms/cm$^3$ and the impurity atom concentration $CP_2'$ of the layer $P_2$ formed in the main thyristor portion MG is approximately $7 \times 10^{17}$ atoms/cm$^3$.

* * * * *